US008283726B2

(12) United States Patent
Su et al.

(10) Patent No.: US 8,283,726 B2
(45) Date of Patent: Oct. 9, 2012

(54) SYSTEM AND METHOD FOR I/O ESD PROTECTION WITH POLYSILICON REGIONS FABRICATED BY PROCESSES FOR MAKING CORE TRANSISTORS

(75) Inventors: Ting Chieh Su, Nantou (TW); Min Chie Jeng, Cupertino, CA (US); Chin Chang Liao, Shanghai (CN); Jun Cheng Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/623,363

(22) Filed: Nov. 20, 2009

(65) Prior Publication Data
US 2010/0059824 A1 Mar. 11, 2010

Related U.S. Application Data

(62) Division of application No. 11/550,529, filed on Oct. 18, 2006, now Pat. No. 7,642,602.

(30) Foreign Application Priority Data

Jun. 12, 2006 (CN) .......................... 2006 1 0027589

(51) Int. Cl.
*H01L 23/62* (2006.01)
(52) U.S. Cl. .................. 257/355; 257/173; 257/365
(58) Field of Classification Search .................. 257/173, 257/365, 355
See application file for complete search history.

(56) References Cited

U.S. PATENT DOCUMENTS

| 4,148,047 A | 4/1979 | Hendrickson |
| 5,034,785 A | 7/1991 | Blanchard |
| 5,164,806 A | 11/1992 | Nagatomo et al. |
| 5,517,049 A | 5/1996 | Huang |

(Continued)

FOREIGN PATENT DOCUMENTS

CN 1360347 A 7/2002

OTHER PUBLICATIONS

Non-Final Office Action for U.S. Appl. No. 11/550,529, mailed on Feb. 23, 2009 8 pages.

(Continued)

*Primary Examiner* — Howard Weiss
*Assistant Examiner* — Tifney Skyles
(74) *Attorney, Agent, or Firm* — Kilpatrick Townsend and Stockton LLP

(57) ABSTRACT

A system and method for electrostatic discharge protection. The system includes a first transistor coupled to a first system and including a first gate, a first dielectric layer located between the first gate and a first substrate, a first source, and a first drain. The first system includes or is coupled to a core transistor, and the core transistor includes a second gate, a second dielectric layer located between the second gate and a second substrate, a second source, and a second drain. The first transistor is selected from a plurality of transistors, and the plurality of transistors include a plurality of gate regions, a plurality of source regions, and a plurality of drain regions. A plurality of polysilicon regions are disposed in an proximity of at least one of the plurality of gate regions. The plurality of polysilicon regions are separated from the first substrate a plurality of dielectric layers.

10 Claims, 10 Drawing Sheets

U.S. PATENT DOCUMENTS

| | | | |
|---|---|---|---|
| 6,639,283 | B1 | 10/2003 | Hung et al. |
| 6,690,067 | B2 | 2/2004 | Ker et al. |
| 7,078,775 | B2 | 7/2006 | Yi et al. |
| 7,265,041 | B2 | 9/2007 | Wu et al. |
| 7,642,602 | B2 | 1/2010 | Su et al. |
| 2002/0149059 | A1* | 10/2002 | Ker et al. ............ 257/355 |
| 2003/0184933 | A1 | 10/2003 | Lin et al. |
| 2003/0210359 | A1 | 11/2003 | Lee et al. |
| 2004/0007742 | A1* | 1/2004 | Cheng et al. ............ 257/355 |

OTHER PUBLICATIONS

Final Office Action for U.S. Appl. No. 11/517,546, mailed on Jan. 11, 2010, 8 pages.

Final Office Action for U.S. Appl. No. 11/517,546, mailed on Oct. 20, 2010, 7 pages.

Non-Final Office Action for U.S. Appl. No. 11/517,546, mailed on Apr. 22, 2011, 10 pages.

Non-Final Office Action for U.S. Appl. No. 11/517,546, mailed on Jun. 23, 2010, 7 pages.

Non-Final Office Action for U.S. Appl. No. 11/517,546, mailed on Jul. 30, 2009, 8 pages.

Non-Final Office Action for U.S. Appl. No. 11/550,529, mailed on Feb. 23, 2009, 8 pages.

Notice of Allowance for U.S. Appl. No. 11/550,529, mailed on Aug. 20, 2009, 7 pages.

Requirement for Restriction/Election for U.S. Appl. No. 11/517,546, mailed on Apr. 2, 2009, 5 pages.

Requirement for Restriction/Election for U.S. Appl. No. 11/550,529, mailed on Dec. 15, 2008, 7 pages.

Final Office Action for U.S. Appl. No. 11/517,546, mailed on Nov. 3, 2011, 12 pages.

Requirement for Restriction/Election for U.S. Appl. No. 12/979,306, mailed on Jan. 23, 2012, 6 pages.

Ex parte Quayle Action for U.S. Appl. No. 12/979,306, mailed on May 11, 2012, 11 pages.

Non-Final Office Action for U.S. Appl. No. 11/517,546, mailed on May 17, 2012, 10 pages.

* cited by examiner

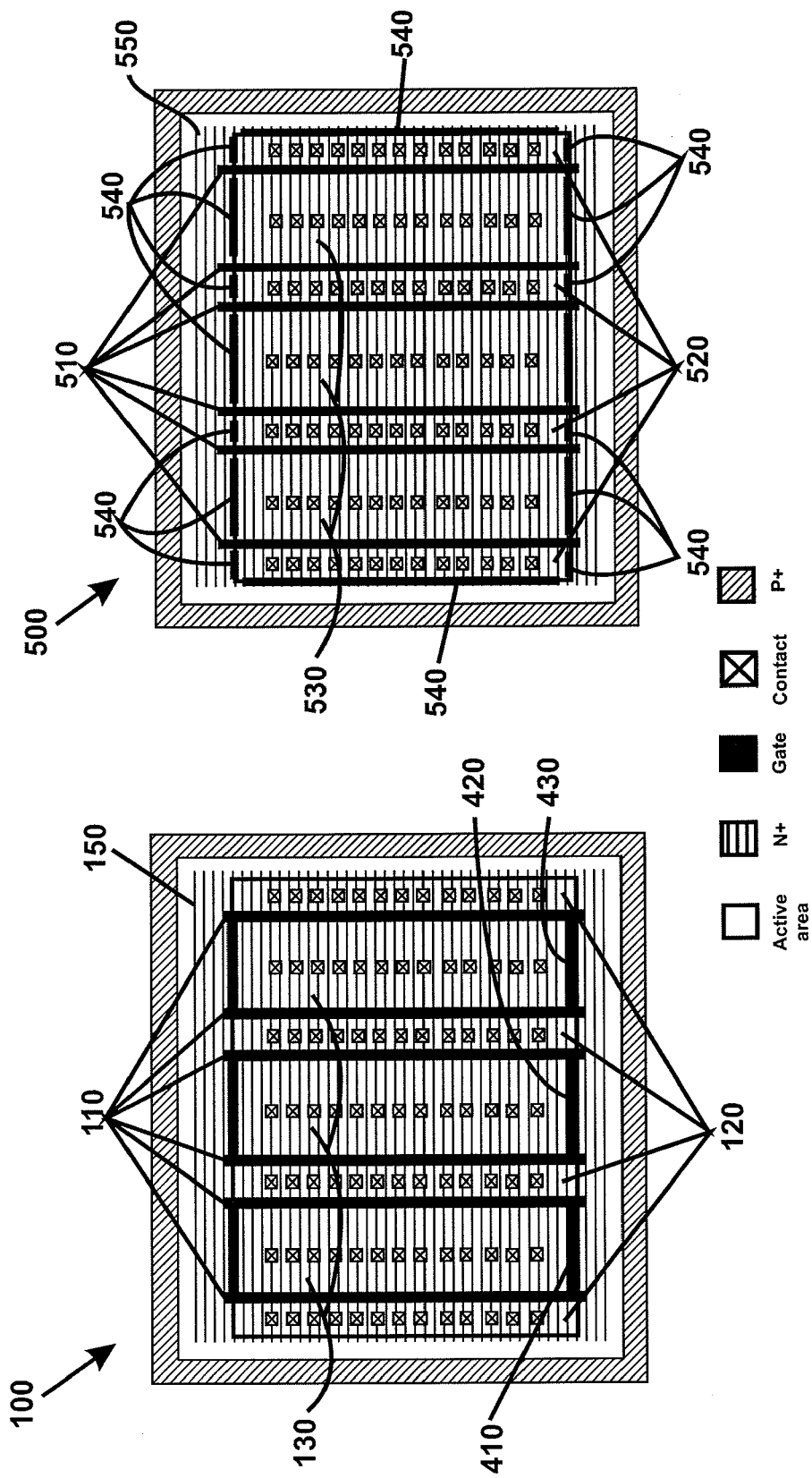

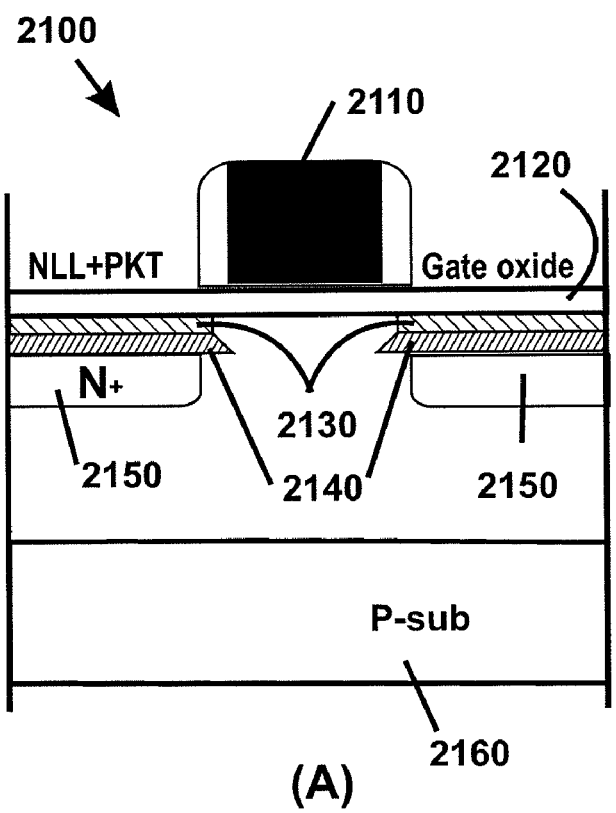
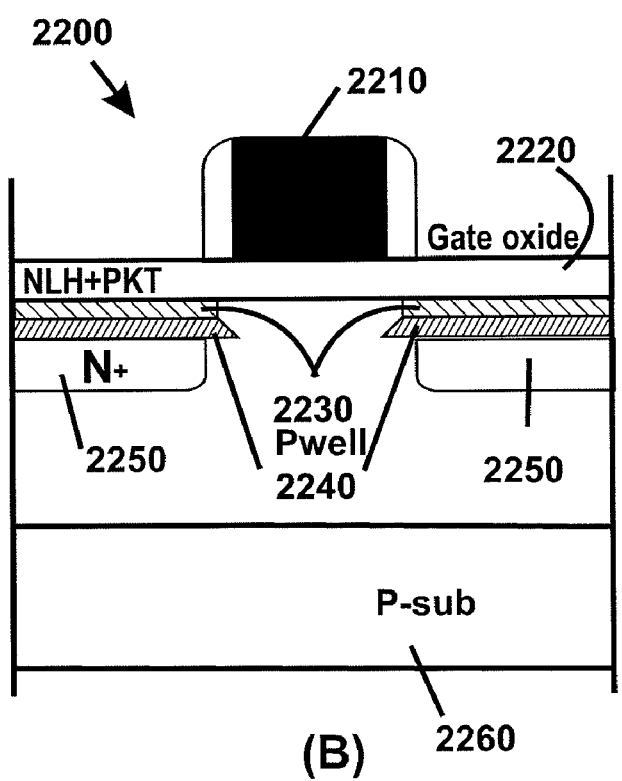
FIGURE 9

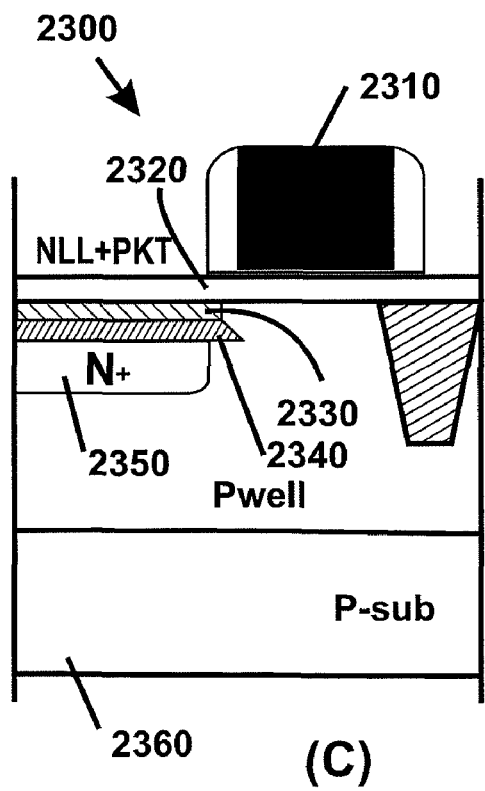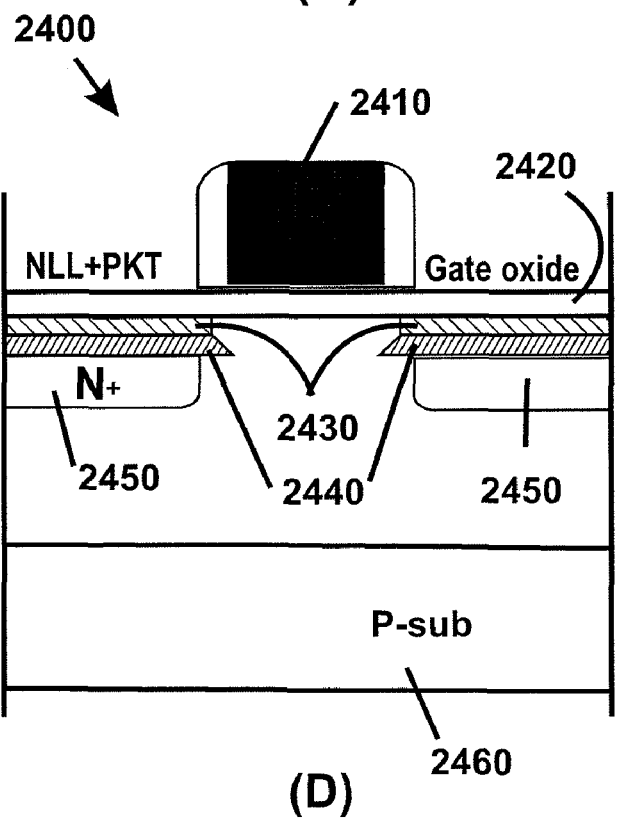
FIGURE 9

SYSTEM AND METHOD FOR I/O ESD PROTECTION WITH POLYSILICON REGIONS FABRICATED BY PROCESSES FOR MAKING CORE TRANSISTORS

CROSS-REFERENCES TO RELATED APPLICATIONS

This application is a divisional application to U.S. patent application Ser. No. 11/550,529 filed Oct. 18, 2006, which claims priority to Chinese Patent Application No. 200610027589.X, filed Jun. 12, 2006, commonly assigned, incorporated by reference herein for all purposes.

This application is related to U.S. patent application Ser. No. 11/517,546, filed Sep. 6, 2006, commonly assigned, incorporated by reference herein for all purposes.

BACKGROUND OF THE INVENTION

The present invention is directed to integrated circuits. More particularly, the invention provides a system and method for electrostatic discharge (ESD) protection with polysilicon regions fabricated by processes for making core transistors. Merely by way of example, the invention has been applied to input/output (I/O) devices. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process and/or device layout often work down to only a certain feature size. An example of such a limit is the ESD protection provided by I/O transistors. An effective protection often requires lowering breakdown voltages of the I/O transistors, but reducing the breakdown voltages can be difficult. Conventionally, an ESD implant has been used for adjusting the breakdown voltages, but the ESD implant often increases fabrication complexity with limited effectiveness.

From the above, it is seen that an improved technique for ESD protection is desired.

BRIEF SUMMARY OF THE INVENTION

The present invention is directed to integrated circuits. More particularly, the invention provides a system and method for electrostatic discharge (ESD) protection with polysilicon regions fabricated by processes for making core transistors. Merely by way of example, the invention has been applied to input/output (I/O) devices. But it would be recognized that the invention has a much broader range of applicability.

In a specific embodiment, the invention provides a system for electrostatic discharge protection. The system includes a first transistor coupled to a first system and including a first gate, a first dielectric layer located between the first gate and a first substrate, a first source, and a first drain. For example, the system includes a plurality of pairs of transistors, and each pair of transistors includes an NMOS transistor and a PMOS transistor. The first system includes or is coupled to a core transistor. For example, the first system includes a core transistor. In another example, the first system includes an I/O transistor that is coupled to a core transistor. In yet another example, the first system includes a core transistor that is coupled to another core transistor. The core transistor includes a second gate, a second dielectric layer located between the second gate and a second substrate, a second source, and a second drain. The first transistor is selected from a plurality of transistors, and the plurality of transistors include a plurality of gate regions, a plurality of source regions, and a plurality of drain regions. Each of the plurality of gate regions intersects a polysilicon region. The polysilicon region is separated from the first substrate by a third dielectric layer, and at least a part of the polysilicon region is located on an active area. The polysilicon region is adjacent to a first doped region and a second doped region, and the first doped region and the second doped region are associated with opposite charge polarities. For example, the first doped region is a heavily doped region, such as an N+ region. In another example, the first doped region is a LDD region. In yet another example, the second doped region is a pocked implant region. The second dielectric layer and the third dielectric layer are associated with the same composition and the same thickness, and the second gate and the polysilicon region are associated with the same composition and the same thickness. For example, the second drain includes a third doped region and a fourth doped region, and the third doped region and the fourth doped region are associated with opposite charge polarities. The first doped region and the third doped region are associated with the same doping profile, and the second doped region and the fourth doped region are associated with the same doping profile.

According to another embodiment, a system for electrostatic discharge protection includes a first transistor coupled to a first system and including a first gate, a first dielectric layer located between the first gate and a first substrate, a first source, and a first drain. For example, the system includes a plurality of pairs of transistors, and each pair of transistors includes an NMOS transistor and a PMOS transistor. The first system includes or is coupled to a core transistor. For example, the first system includes a core transistor. In another example, the first system includes an I/O transistor that is coupled to a core transistor. In yet another example, the first system includes a core transistor that is coupled to another core transistor. The core transistor includes a second gate, a second dielectric layer located between the second gate and a second substrate, a second source, and a second drain. The first transistor is selected from a plurality of transistors, and the plurality of transistors includes a plurality of gate regions, a plurality of source regions, and a plurality of drain regions. The first substrate is separated from a first plurality of polysilicon regions by a first plurality of dielectric layers, and at least a part of each of the first plurality of polysilicon regions is located on an active area. The first plurality of polysilicon regions is not in direct contact with each other. Each of the first plurality of polysilicon regions is adjacent to a first doped region and a second doped region, and the first doped region and the second doped region are associated with opposite charge polarities. For example, the first doped region is a heavily doped region, such as an N+ region. In another example, the first doped region is a LDD region. In yet another example, the second doped region is a pocked implant region. The second dielectric layer and the first plurality of dielectric layers are associated with the same composition and the same thickness, and the second gate and the first plurality of polysilicon regions are associated with the same composition and the same thickness. For example, the second drain includes a third doped region and a fourth doped region, and the third doped region and the fourth doped region are associated with opposite charge polarities. The first doped region and the third doped region are associated with the same doping profile, and the second doped region and the fourth doped region are associated with the same doping profile.

According to yet another embodiment, a system for electrostatic discharge protection includes a first transistor coupled to a first system and including a first gate, a first dielectric layer located between the first gate and a first substrate, a first source, and a first drain. For example, the system includes a plurality of pairs of transistors, and each pair of transistors includes an NMOS transistor and a PMOS transistor. The first system includes or is coupled to a core transistor. For example, the first system includes a core transistor. In another example, the first system includes an I/O transistor that is coupled to a core transistor. In yet another example, the first system includes a core transistor that is coupled to another core transistor. The first system includes or is coupled to a core transistor, and the core transistor includes a second gate, a second dielectric layer located between the second gate and a second substrate, a second source, and a second drain. The first transistor is selected from a plurality of transistors, and the plurality of transistors includes a plurality of gate regions, a plurality of source regions, and a plurality of drain regions. The first substrate is separated from a plurality of polysilicon regions by a plurality of dielectric layers, and the plurality of polysilicon regions is on one of the plurality of drain regions or one of the plurality of source regions. The plurality of polysilicon regions is not in direct contact with each other, and each of the plurality of polysilicon regions is not in direct contact with anyone of the plurality of gate regions. Each of the plurality of polysilicon regions is adjacent to a first doped region and a second doped region, and the first doped region and the second doped region are associated with opposite charge polarities. For example, the first doped region is a heavily doped region, such as an N+ region. In another example, the first doped region is a LDD region. In yet another example, the second doped region is a pocked implant region. The second dielectric layer and the plurality of dielectric layers are associated with the same composition and the same thickness, and the second gate and the plurality of polysilicon regions are associated with the same composition and the same thickness. For example, the second drain includes a third doped region and a fourth doped region, and the third doped region and the fourth doped region are associated with opposite charge polarities. The first doped region and the third doped region are associated with the same doping profile, and the second doped region and the fourth doped region are associated with the same doping profile.

According to still another embodiment, a system for electrostatic discharge protection includes a first transistor coupled to a first system and including a first gate, a first dielectric layer located between the first gate and a first substrate, a first source, and a first drain. The first system includes or coupled to a core transistor, which has a second gate, a second dielectric layer located between the second gate and a second substrate, a second source, and a second drain. The first transistor is selected from a plurality of transistors, which includes a plurality of gate regions, a plurality of source regions, and a plurality of drain regions. A plurality of polysilicon regions are disposed in an proximity of at least one of the plurality of gate regions. The plurality of polysilicon regions are separated from the first substrate a plurality of dielectric layers. Each of the plurality of polysilicon regions is adjacent to a first doped region and a second doped region, which are associated with a single charge polarity. The second dielectric layer and the plurality of dielectric layers are associated with the same composition and the same thickness. The second gate and the plurality of polysilicon regions are associated with the same composition and the same thickness.

In an embodiment of the above system, the plurality of polysilicon regions is on one of the plurality of drain regions or one of the plurality of drain regions. In another embodiment, the plurality of polysilicon regions are not in direct contact with each other and each of the plurality of polysilicon regions is not in contact with anyone of the plurality of gate regions. In yet another embodiment, at least one of the plurality of polysilicon regions is in direct contact with one of the plurality of gate regions.

Many benefits are achieved by way of the present invention over conventional techniques. For example, the present technique provides an easy to use system and method. According to certain embodiments, the system and method are compatible with conventional technology. Some embodiments of the present invention improve the I/O ESD protection technique. For example, the junction breakdown voltages of MOS transistors are significantly lowered. In another example, the I/O transistors can turn on junction breakdown and thus prevent or reduce damages for self-protection from ESD stress. Certain embodiments of the present invention can effectively delay the time when the ESD stress current reaches the gate regions. Some embodiments of the present invention comply with the ESD design rule. For example, to dissipate significant heat generated by high-density ESD current, the ESD design rule often allows relatively large spacing between the gate regions and drain contacts. In another example, the polysilicon regions can be inserted to the drain regions of the I/O transistors in order to increase lengths of the current paths and raise the drain resistance without violating the ESD design rule. Certain embodiments of the present invention provide junction doping profiles between heavily doped regions and pocket implant regions related to floating and/or biased polysilicon regions, which are steeper than junction doping profiles between heavily doped regions and pocket implant regions for I/O transistors. For example, the heavily doped regions and pocket implant regions related to floating and/or biased polysilicon regions are made with the same implant processes as ones used for making the heavily doped regions and pocket implant regions for core transistors. Some embodiments of the present invention provide junction doping profiles between LDD regions and pocket implant regions related to floating and/or biased polysilicon regions, which are steeper than junction doping profiles between LDD regions and pocket implant regions for I/O transistors. For example, the LDD regions and pocket implant regions related to floating and/or biased polysilicon regions are made with the same implant processes as ones used for making the LDD regions and pocket implant regions for core transistors. Certain embodiments of the present invention make junction breakdown voltages related to floating and/or biased polysilicon regions significantly lower than junction breakdown voltages of conventional I/O transistors. When an ESD event occurs, the lower junction breakdown voltages allow turning on the junction breakdown more quickly; therefore the I/O transistors can be protected from ESD damage more effectively. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 5 is a simplified system for electrostatic discharge protection according to another embodiment of the present invention;

FIG. 6 is a simplified system for electrostatic discharge protection according to yet another embodiment of the present invention;

FIGS. 9(A), (B), (C), and (D) are simplified diagrams showing certain details of systems for electrostatic discharge protection according to certain embodiments of the present invention.

DETAILED DESCRIPTION OF THE INVENTION

The present invention is directed to integrated circuits. More particularly, the invention provides a system and method for electrostatic discharge (ESD) protection with polysilicon regions fabricated by processes for making core transistors. Merely by way of example, the invention has been applied to input/output (I/O) devices. But it would be recognized that the invention has a much broader range of applicability.

Figure 1:
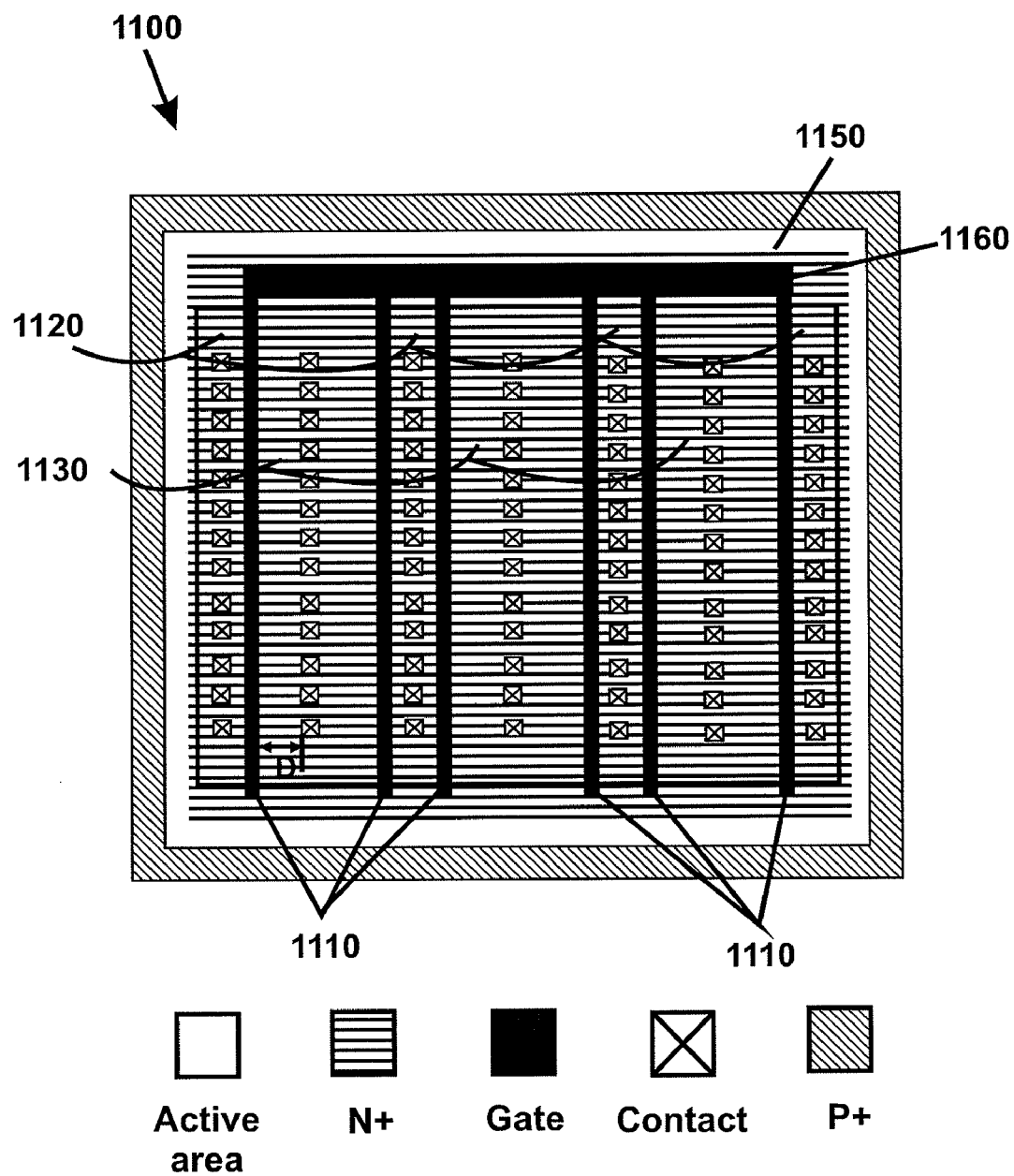
FIG. 1 is a simplified conventional system for electrostatic discharge protection.

FIG. 1 is a simplified conventional system for electrostatic discharge protection. The system 1100 includes gate regions 1110, source regions 1120, drain regions 1130, an active area 1150, and a polysilicon region 1160. The gate regions 1110, the source regions 1120, and the drain regions 1130 are used to form I/O transistors in the active area 1150. The gate regions are electrically shorted to each other by the polysilicon region 1160, and the polysilicon region 1160 is located completely outside the active area 1150.

Figure 2:
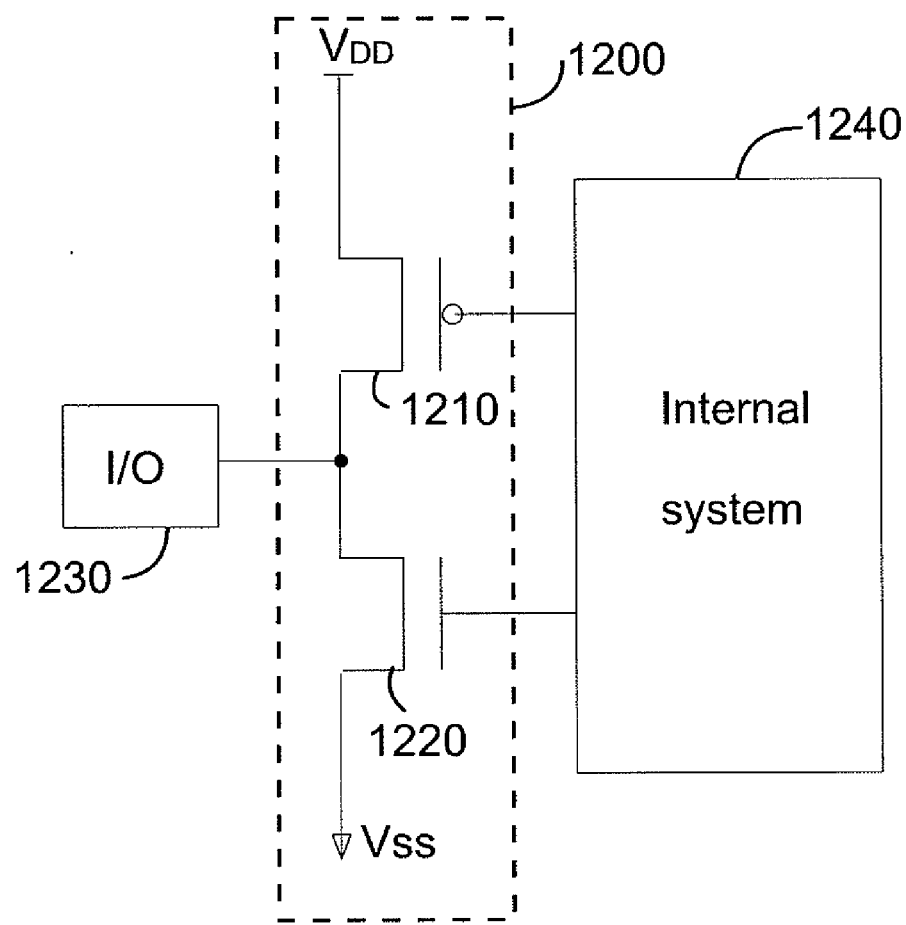
FIG. 2 is a simplified system for electrostatic discharge protection according to an embodiment of the present invention.

FIG. 2 is a simplified system for electrostatic discharge protection according to yet another embodiment of the present invention. This diagram is merely an example, which should not unduly limit the scope of the claims. One of ordinary skill in the art would recognize many variations, alternatives, and modifications. The system 1200 includes a PMOS transistor 1210 and an NMOS transistor 1220. The source of the PMOS transistor 1210 is biased to a voltage level $V_{DD}$, and the source of the NMOS transistor 1220 is biased to a voltage level $V_{SS}$. The drain of the PMOS transistor 1210 and the drain of the NMOS transistor 1220 are connected to an I/O pad 1230, and the gate of the PMOS transistor 1210 and the gate of the NMOS transistor 1220 are connected to an internal system 1240. For example, the internal system 1240 is protected by the system 1200. In another example, the internal system 1240 includes one or more core transistors and/or is coupled to one or more core transistors. The PMOS transistor 1210 represents one or more I/O transistors and the NMOS transistor 1220 represents one or more I/O transistors as shown in FIGS. 3, 4, 5, 6, 7(A) and (B), 8(A), 8(B), 8(C), 9(A), 9(B), 9(C), and/or 9(D). For example, the system 1200 includes one or more pairs of I/O transistors, and each pair of I/O transistors includes an NMOS transistor and a PMOS transistor.

Figure 3:
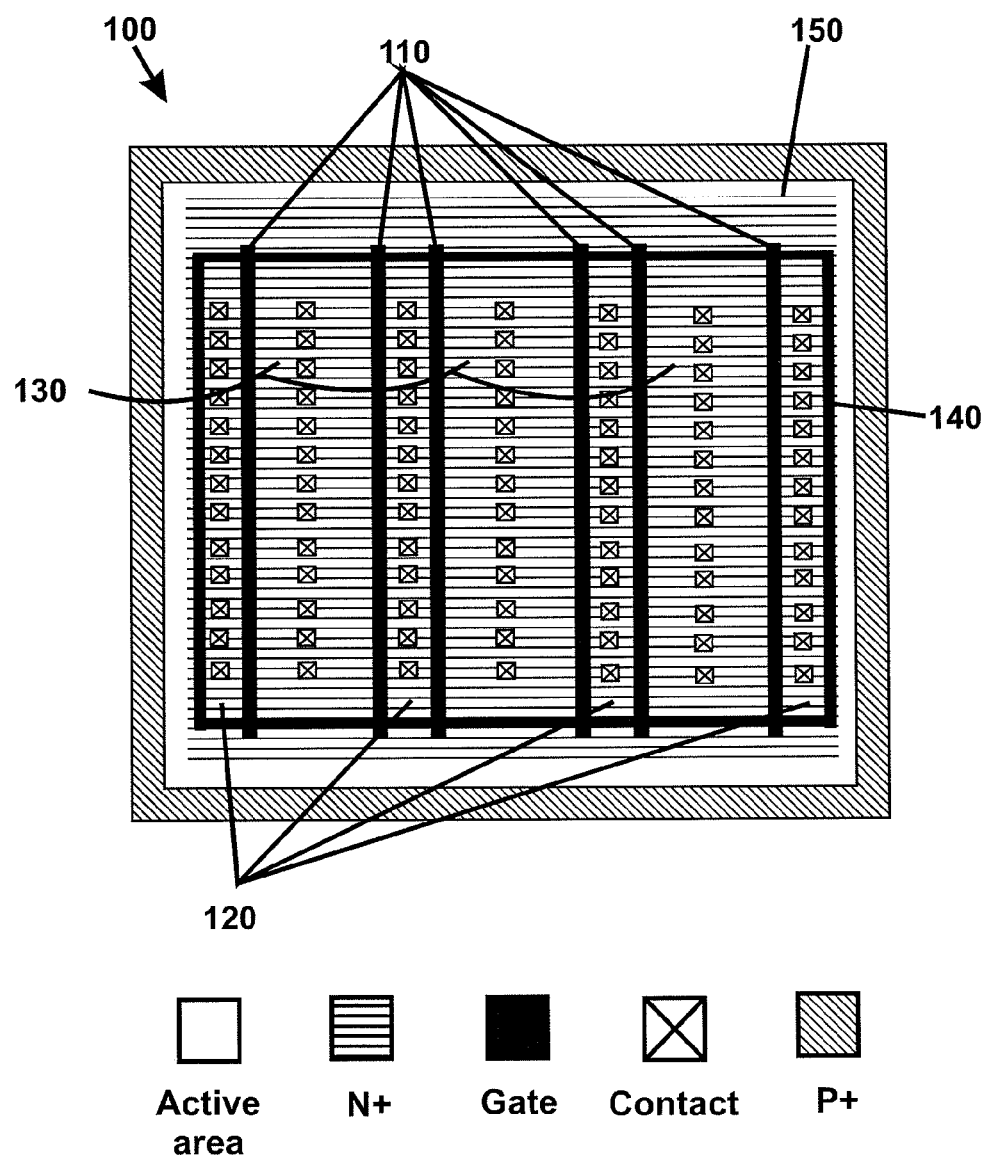
FIG. 3 is a simplified system for electrostatic discharge protection according to an embodiment of the present invention.

FIG. 3 is a simplified system for electrostatic discharge protection according to an embodiment of the present invention. This diagram is merely an example, which should not unduly limit the scope of the claims. One of ordinary skill in the art would recognize many variations, alternatives, and modifications. The system 100 includes the following components:

1. Gate regions 110;
2. Source regions 120;
3. Drain regions 130;
4. Polysilicon region 140;
5. Active area 150.

Although the above has been shown using a selected group of components for the system 100, there can be many alternatives, modifications, and variations. For example, some of the components may be expanded and/or combined. Other components may be inserted to those noted above. Depending upon the embodiment, the arrangement of components may be interchanged with others replaced. For example, the I/O transistors in the active area 150 are PMOS transistors. Further details of these components are found throughout the present specification and more particularly below.

The gate regions 110, the source regions 120, and the drain regions 130 are used to form I/O transistors in the active area 150. For example, the active area 150 includes the source regions 120 and the drain regions 130. In another example, each of the source regions 120 includes a doped region, and each of the drain regions 130 includes a doped region. In yet another example, the I/O transistors in the active area 150 are NMOS transistors. As shown in FIG. 2, the polysilicon region 140 intersects the gate regions 110. The gate regions 110 are electrically connected to the polysilicon region 140. In one embodiment, the polysilicon region 140 has the same voltage potential as the gate regions 110. In another embodiment, the polysilicon region 140 surrounds the source regions 120 and the drain regions 130. For example, the polysilicon region 140 is partially or completely located within the active area 150. In another example, the gate regions 110 are electrically shorted to each other by another polysilicon region located outside the active area 150.

Figure 4:
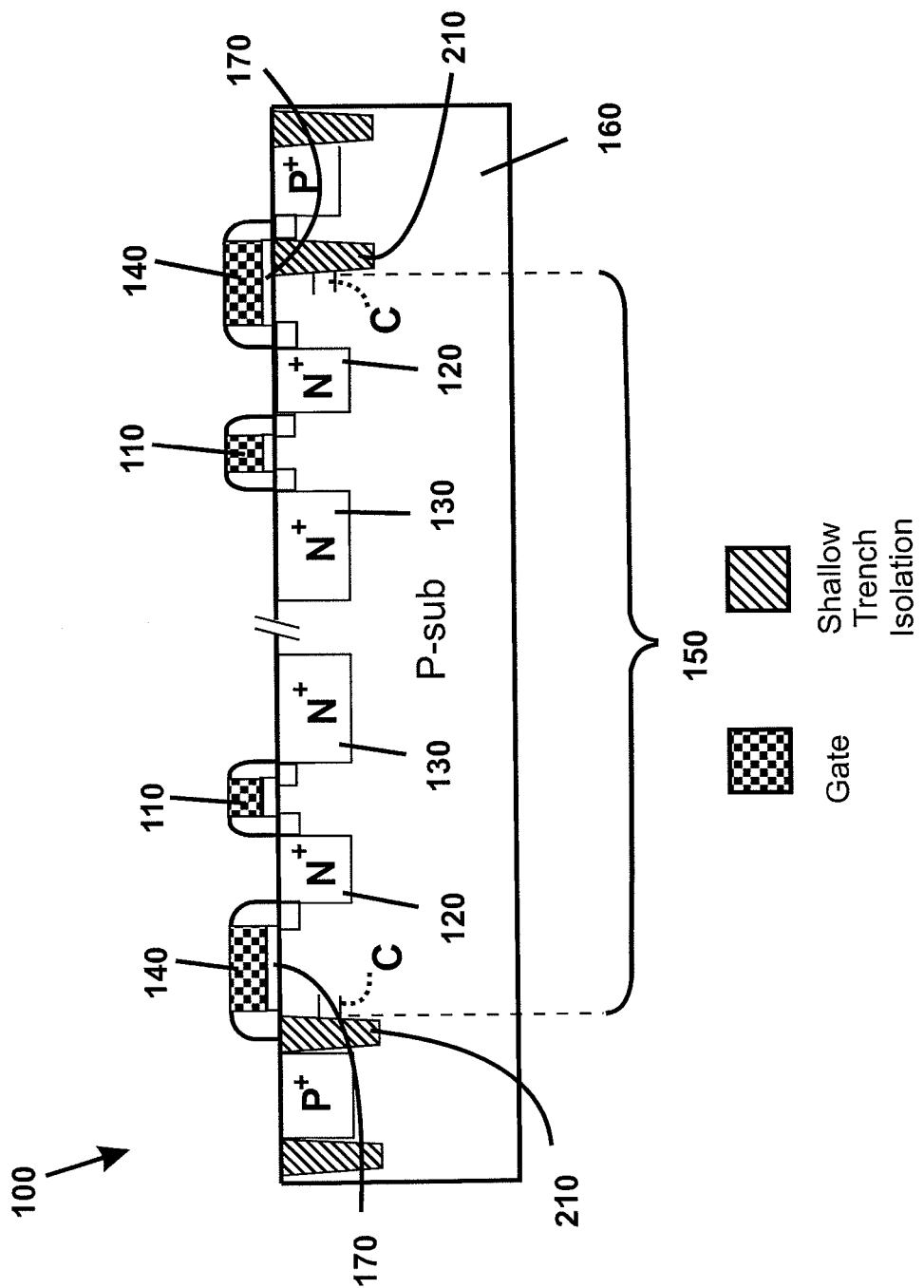
FIG. 4 is a simplified cross-section for electrostatic discharge protection according to an embodiment of the present invention.

FIG. 4 is a simplified cross-section for the system 100 for electrostatic discharge protection according to an embodiment of the present invention. This diagram is merely an example, which should not unduly limit the scope of the claims. One of ordinary skill in the art would recognize many variations, alternatives, and modifications. As shown in FIG. 4, the active area 150 is isolated by shallow trench isolation (STI) regions 210. For example, in the top view, the polysilicon region 140 is partially located within the active area 150 for the I/O transistors. Additionally, the system 100 also includes a substrate 160 and a dielectric layer 170. The substrate 160 includes the active area 150, and is separated from the polysilicon region 140 by the dielectric layer 170. For example, the dielectric layer 170 includes silicon oxide.

In one embodiment, the substrate 160 is doped to p-type. The source regions 120 and the drain regions 130 include N+ regions. For example, the substrate 160 also includes a p-well. In another example, the substrate 160 also includes at least two LDD regions for each of the N+ regions. The two LDD regions are in direct contact with the corresponding N+ region. In yet another example, the substrate 160 also includes two p-type regions made by pocket implants for each of the N+ regions.

The I/O transistors of the system 100 can be used in the system 1200, which can provide protection to the system 1240. For example, the internal system 1240 includes one or more core transistors and/or is coupled to one or more core transistors. A core transistor includes a gate region and a gate dielectric layer, such as a gate oxide layer. For example, the gate region of the core transistor has the same composition and the same thickness as the polysilicon region 140. In another example, the gate dielectric layer of the core transistor has the same composition and the same thickness as the dielectric layer 170.

According to an embodiment of the present invention, a core transistor is directly or indirectly coupled between a ground voltage level of $V_{SS,CORE}$ and a supply voltage level of $V_{DD,CORE}$. For example, the source or the drain of the core transistor is biased to the supply voltage level of $V_{DD,CORE}$. In another example, the source or the drain of the core transistor is biased to the ground voltage level of $V_{SS,CORE}$. As shown in FIG. 2, the transistors 1210 and 1220 each represent one or more I/O transistors and each are indirectly coupled between the ground voltage level of $V_{SS}$ and the supply voltage level of $V_{DD}$. For example, the ground voltage level of $V_{SS,CORE}$ is the same as the ground voltage level of $V_{SS}$, and the supply voltage level of $V_{DD,CORE}$ is smaller in magnitude than the supply voltage level of $V_{DD}$. In another example, the ground voltage level of $V_{SS,CORE}$ is the same as the ground voltage level of $V_{SS}$, and the supply voltage level of $V_{DD,CORE}$ is equal to 1.8 volts and the supply voltage level of $V_{DD}$ is equal to 3.3 volts.

As discussed above and further emphasized here, FIGS. 3 and 4 are merely examples, which should not unduly limit the scope of the claims. One of ordinary skill in the art would recognize many variations, alternatives, and modifications. FIG. 5 is a simplified system for electrostatic discharge protection according to another embodiment of the present invention. The polysilicon region 140 in the system 100 is replaced by polysilicon regions 410, 420, and 430. For example, the polysilicon regions 410, 420, and 430 and the gate regions 110 surround the drain regions 130. The polysilicon regions 410, 420, and 430 are partially or completely located within the active area 150, and separated from the substrate by dielectric layers. For example, the dielectric layers include silicon oxide. In another example, the dielectric layers are separated from each other or in contact with each other. In yet another example, the gate regions 110 are electrically shorted to each other by another polysilicon region located outside the active area 150.

In one embodiment, the substrate is doped to p-type. The source regions 120 and the drain regions 130 include N+ regions. For example, the substrate also includes a p-well. In another example, the substrate 160 also includes at least two LDD regions for each of the N+ regions. The two LDD regions are in direct contact with the corresponding N+ region. In yet another example, the substrate 160 also includes two p-type regions made by pocket implants for each of the N+ regions.

The I/O transistors of the system 100 can be used in the system 1200, which can provide ESD protection to the system 1240. For example, the internal system 1240 includes one or more core transistors and/or is coupled to one or more core transistors. A core transistor includes a gate region and a gate dielectric layer, such as a gate oxide layer. For example, the gate region of the core transistor has the same composition and the same thickness as the polysilicon regions 410, 420, and 430. In another example, the gate dielectric layer of the core transistor has the same composition and the same thickness as the dielectric layers separating the polysilicon regions 410, 420, and 430 from the substrate.

According to an embodiment of the present invention, a core transistor is directly or indirectly coupled between a ground voltage level of $V_{SS,CORE}$ and a supply voltage level of $V_{DD,CORE}$. For example, the source or the drain of the core transistor is biased to the supply voltage level of $V_{DD,CORE}$. In another example, the source or the drain of the core transistor is biased to the ground voltage level of $V_{SS,CORE}$. As shown in FIG. 2, the transistors 1210 and 1220 each represent one or more I/O transistors and each are indirectly coupled between the ground voltage level of $V_{SS}$ and the supply voltage level of $V_{DD}$. For example, the ground voltage level of $V_{SS,CORE}$ is the same as the ground voltage level of $V_{SS}$, and the supply voltage level of $V_{DD,CORE}$ is smaller in magnitude than the supply voltage level of $V_{DD}$. In another example, the ground voltage level of $V_{SS,CORE}$ is the same as the ground voltage level of $V_{SS}$, and the supply voltage level of $V_{DD,CORE}$ is equal to 1.8 volts and the supply voltage level of $V_{DD}$ is equal to 3.3 volts.

FIG. 6 is a simplified system for electrostatic discharge protection according to yet another embodiment of the present invention. This diagram is merely an example, which should not unduly limit the scope of the claims. One of ordinary skill in the art would recognize many variations, alternatives, and modifications. The system 500 includes the following components:

1. Gate regions 510;
2. Source regions 520;
3. Drain regions 530;
4. Polysilicon region 540;
5. Active area 550.

Although the above has been shown using a selected group of components for the system 500, there can be many alternatives, modifications, and variations. For example, some of the components may be expanded and/or combined. Other components may be inserted to those noted above. Depending upon the embodiment, the arrangement of components may be interchanged with others replaced. For example, the I/O transistors in the active area 550 are PMOS transistors. Further details of these components are found throughout the present specification and more particularly below.

The gate regions 510, the source regions 520, and the drain regions 530 are used to form I/O transistors in the active area 550. For example, the active area 550 includes the source regions 520 and the drain regions 530. In another example, the I/O transistors in the active area 550 are NMOS transistors. As shown in FIG. 6, the polysilicon region 540 does not intersect the gate regions 510. The gate regions 510 are not in direct contact with the polysilicon region 540. For example, the polysilicon region 540 includes a plurality of sub-regions, and the plurality of sub-regions is not in direct contact with each other.

In one embodiment, the polysilicon region 540 is at least partially around the source regions 520 and the drain regions 530. In another embodiment, the polysilicon region 540 is partially or completely located within the active area 550. In yet another embodiment, the polysilicon region 540 is separated from the substrate by dielectric layers. For example, the dielectric layers include silicon oxide. In another example, the dielectric layers are separated from each other or in direct contact with each other. In yet another embodiment, the gate regions 510 are electrically shorted to each other by another polysilicon region located outside the active area 550.

In another embodiment, the substrate is doped to p-type. The source regions 520 and the drain regions 530 include N+ regions. For example, the substrate also includes a p-well. In another example, the substrate 560 also includes at least two LDD regions for each of the N+ regions. The two LDD regions are in direct contact with the corresponding N+ region. In yet another example, the substrate 560 also includes two p-type regions made by pocket implants for each of the N+ regions.

The I/O transistors of the system 500 can be used in the system 1200, which can provide ESD protection to the system 1240. For example, the internal system 1240 includes one or more core transistors and/or is coupled to one or more core transistors. A core transistor includes a gate region and a gate dielectric layer, such as a gate oxide layer. For example, the gate region of the core transistor has the same composition and the same thickness as the polysilicon region 540. In another example, the gate dielectric layer of the core transistor has the same composition and the same thickness as the dielectric layer separating the polysilicon region 540 from the substrate.

According to an embodiment of the present invention, a core transistor is directly or indirectly coupled between a ground voltage level of $V_{SS,CORE}$ and a supply voltage level of $V_{DD,CORE}$. For example, the source or the drain of the core transistor is biased to the supply voltage level of $V_{DD,CORE}$. In another example, the source or the drain of the core transistor is biased to the ground voltage level of $V_{SS,CORE}$. As shown in FIG. 2, the transistors 1210 and 1220 each represent one or more I/O transistors and each are indirectly coupled between the ground voltage level of $V_{SS}$ and the supply voltage level of $V_{DD}$. For example, the ground voltage level of $V_{SS,CORE}$ is the same as the ground voltage level of $V_{SS}$, and the supply voltage level of $V_{DD,CORE}$ is smaller in magnitude than the supply voltage level of $V_{DD}$. In another example, the ground voltage level of $V_{SS,CORE}$ is the same as the ground voltage level of $V_{SS}$, and the supply voltage level of $V_{DD,CORE}$ is equal to 1.8 volts and the supply voltage level of $V_{DD}$ is equal to 3.3 volts.

Figure 7:
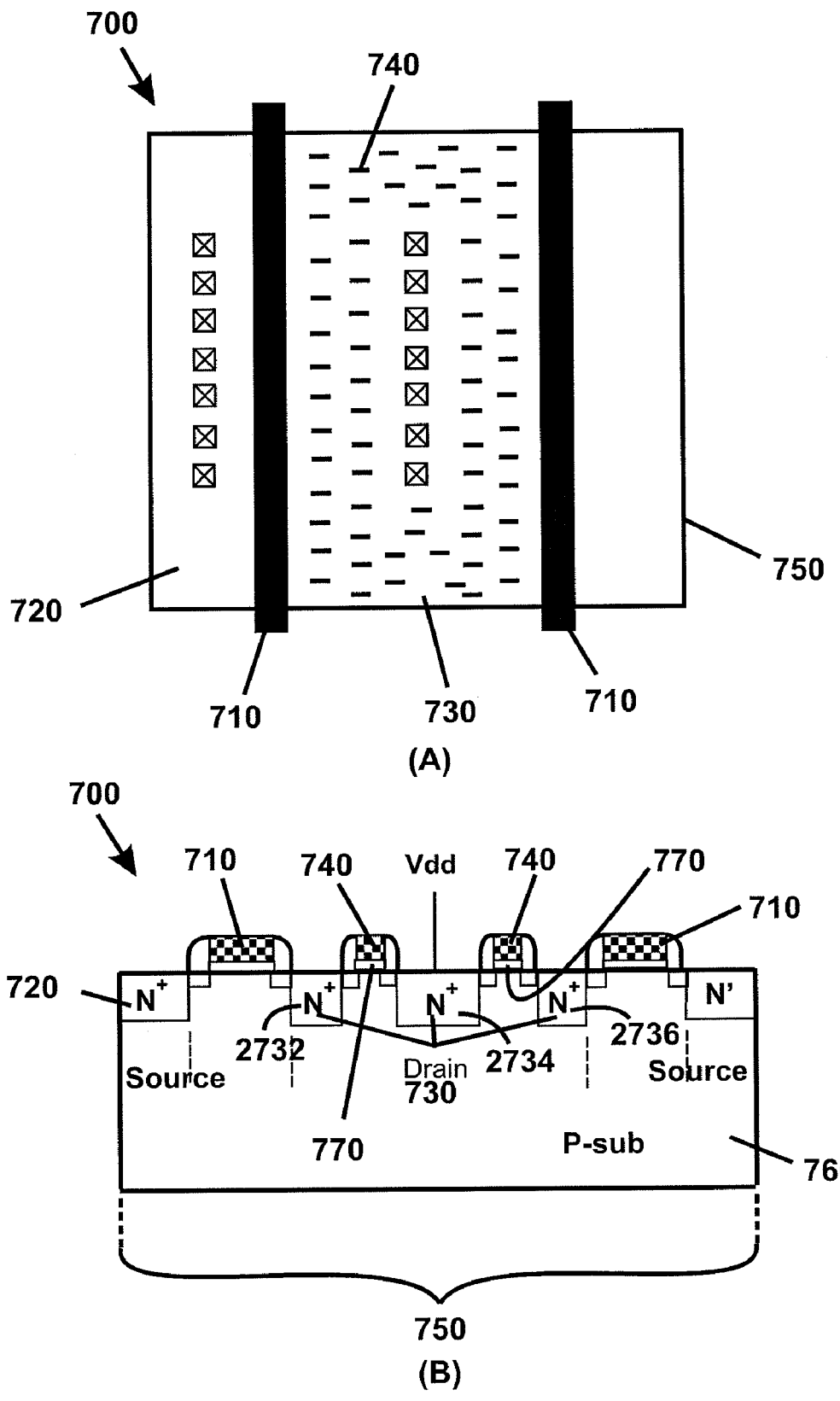
FIGS. 7(A) and (B) are simplified diagrams showing system for electrostatic discharge protection according to yet another embodiment of the present invention.

FIGS. 7(A) and (B) are simplified diagrams showing system for electrostatic discharge protection according to yet another embodiment of the present invention. This diagram is merely an example, which should not unduly limit the scope of the claims. One of ordinary skill in the art would recognize many variations, alternatives, and modifications. The system 700 includes the following components:
1. Gate regions 710;
2. Source regions 720;
3. Drain regions 730;
4. Polysilicon regions 740;
5. Active area 750;
6. Substrate 760;
7. Dielectric layers 770.

Although the above has been shown using a selected group of components for the system 700, there can be many alternatives, modifications, and variations. For example, some of the components may be expanded and/or combined. Other components may be inserted to those noted above. For example, the regions 720 can serve as drains, and the regions 730 can serve as sources. Depending upon the embodiment, the arrangement of components may be interchanged with others replaced. For example, the I/O transistors in the active area 750 are PMOS transistors. Further details of these components are found throughout the present specification and more particularly below.

The gate regions 710, the source regions 720, and the drain regions 730 are used to form I/O transistors in the active area 750. For example, the active area 750 includes the source regions 720 and the drain regions 730. In another example, the I/O transistors in the active area 750 are NMOS transistors.

As shown in FIG. 7(A), the polysilicon regions 740 are not in direct contact with the gate regions 710, and the polysilicon regions 740 are not in direct contact with each other. In one embodiment, the polysilicon regions 740 are located within the drain regions 730 in the top view. In another embodiment, the polysilicon regions 740 are located within the source regions 720 in the top view. In yet another embodiment, the polysilicon regions 740 are located within both the source regions 720 and the drain regions 730 in the top view. In yet another embodiment, the gate regions 710 are electrically shorted to each other by another polysilicon region located outside the active area 750.

As shown in FIG. 7(B), the substrate 760 includes the active area 750, and is separated from the polysilicon regions 740 by the dielectric layers 770. For example, the dielectric layers 770 include silicon oxide. In another example, the dielectric layers 770 are separated from each other or in direct contact with each other. Each of the source regions 720 includes a doped region, and each of the drain regions 730 includes doped regions 2732, 2734, and 2736 in the substrate 760. The doped regions 2732, 2734, and 2736 are not in direct contact with each other. In one embodiment, the substrate 760 is doped to p-type, and the doped regions 2732, 2734, and 2736 are N+ regions. For example, the substrate 760 also includes a p-well. In another example, the substrate 760 also includes at least two LDD regions for each of the doped regions 2732, 2734, and 2736. The two LDD regions are in direct contact with the corresponding doped region. In yet another example, the substrate 760 also includes two p-type regions made by pocket implants for each of the doped regions 2732, 2734, and 2736.

The I/O transistors of the system 700 can be used in the system 1200, which can provide ESD protection to the system 1240. For example, the internal system 1240 includes one or more core transistors and/or is coupled to one or more core transistors. A core transistor includes a gate region and a gate dielectric layer, such as a gate oxide layer. For example, the gate region of the core transistor has the same composition and the same thickness as the polysilicon regions 740. In another example, the gate dielectric layer of the core transistor has the same composition and the same thickness as the dielectric layers 770 separating the polysilicon regions 740 from the substrate 760.

According to an embodiment of the present invention, a core transistor is directly or indirectly coupled between a ground voltage level of $V_{SS,CORE}$ and a supply voltage level of $V_{DD,CORE}$. For example, the source or the drain of the core transistor is biased to the supply voltage level of $V_{DD,CORE}$. In another example, the source or the drain of the core transistor is biased to the ground voltage level of $V_{SS,CORE}$. As shown in FIG. 2, the transistors 1210 and 1220 each represent one or more I/O transistors and each are indirectly coupled between the ground voltage level of $V_{SS}$ and the supply voltage level of $V_{DD}$. For example, the ground voltage level of $V_{SS,CORE}$ is the same as the ground voltage level of $V_{SS}$, and the supply voltage level of $V_{DD,CORE}$ is smaller in magnitude than the supply voltage level of $V_{DD}$. In another example, the ground voltage level of $V_{SS,CORE}$ is the same as the ground voltage level of $V_{SS}$, and the supply voltage level of $V_{DD,CORE}$ is equal to 1.8 volts and the supply voltage level of $V_{DD}$ is equal to 3.3 volts.

Figure 8:
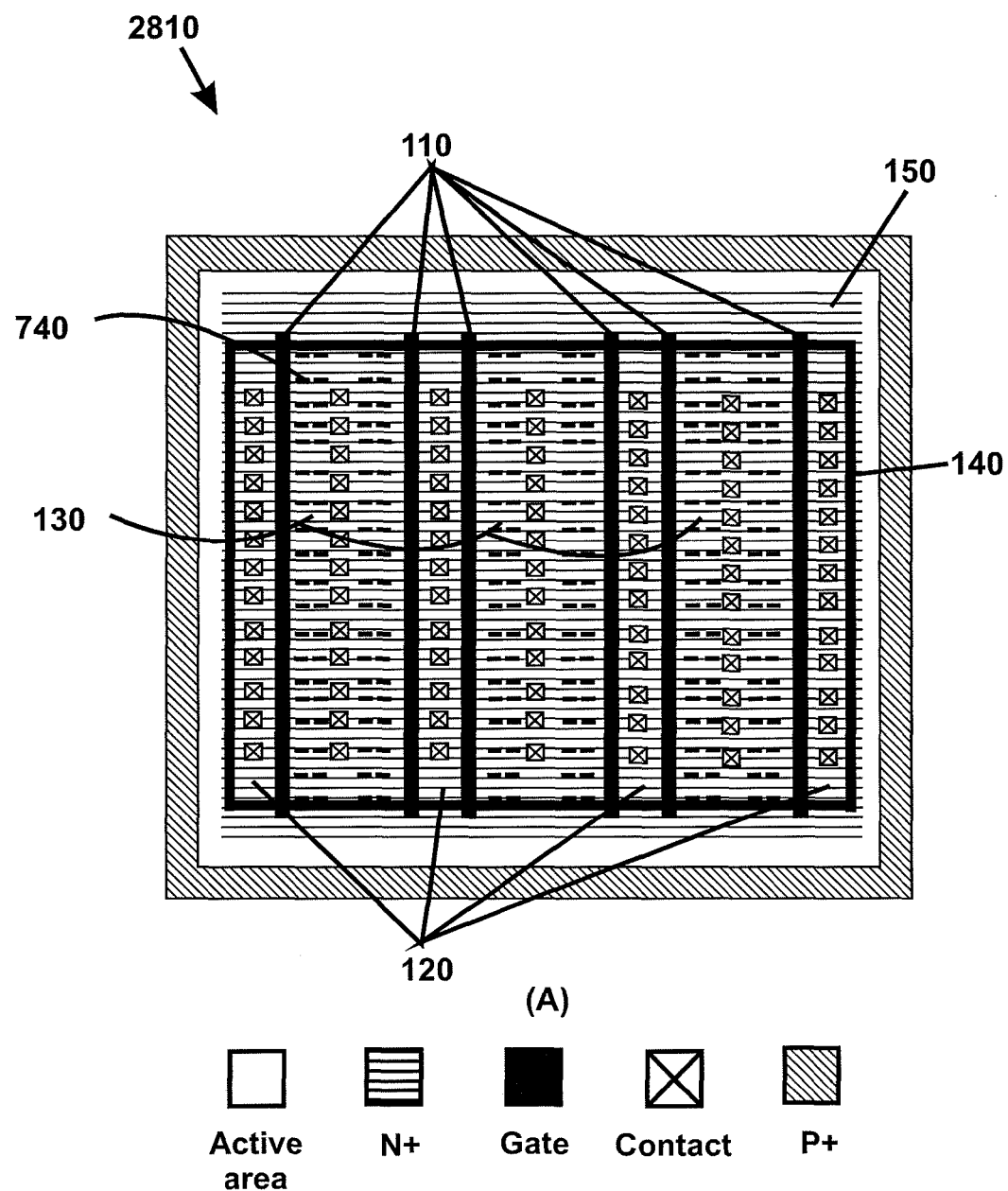
FIGS. 8(A), (B), and (C) are simplified diagrams showing systems for electrostatic discharge protection according to yet other embodiments of the present invention.
Figure 8:
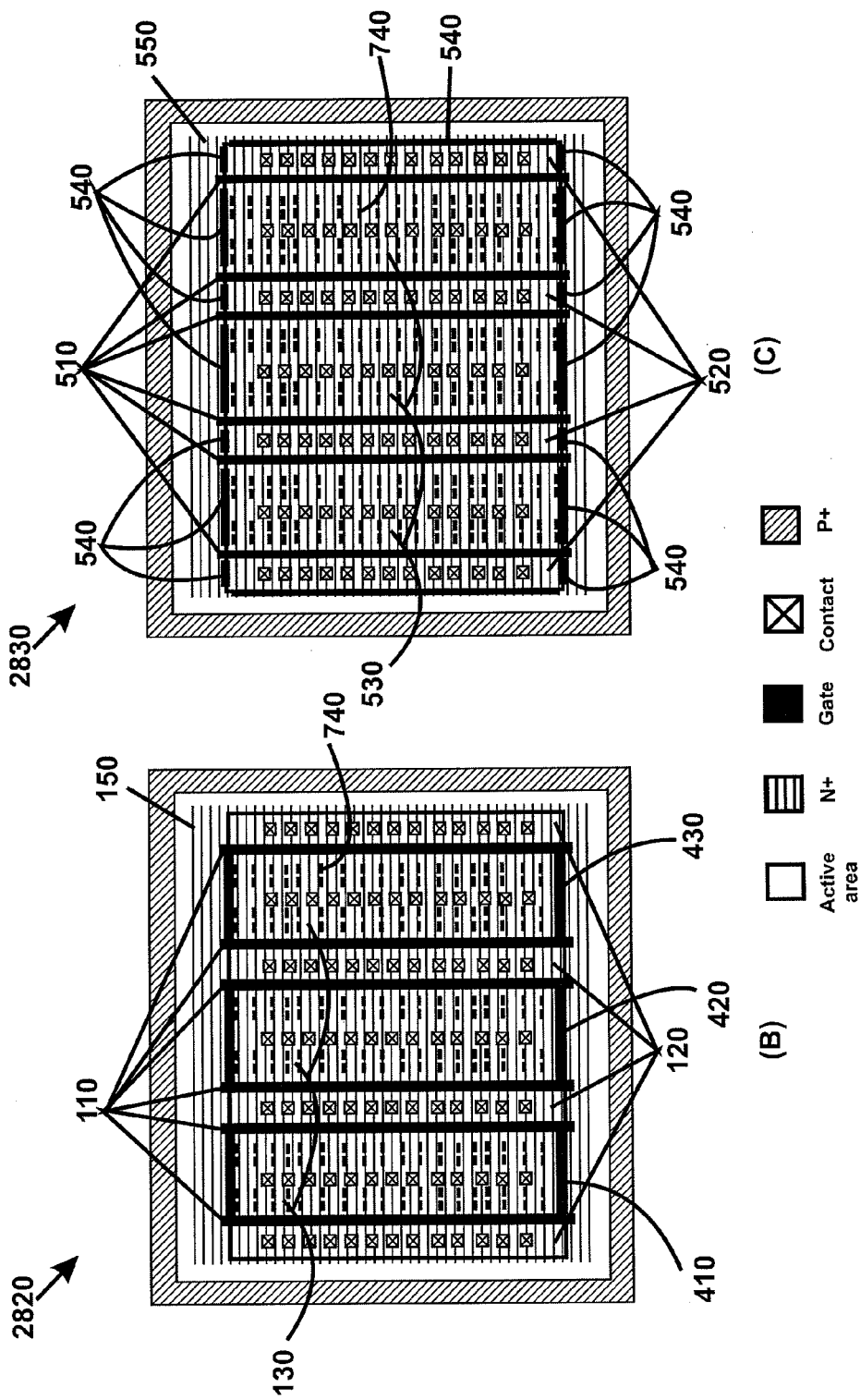

As discussed above and further emphasized here, FIGS. 7(A) and (B) are merely examples, which should not unduly limit the scope of the claims. One of ordinary skill in the art would recognize many variations, alternatives, and modifications. FIGS. 8(A), (B), and (C) are simplified diagrams showing systems for electrostatic discharge protection according to yet other embodiments of the present invention. These diagrams are merely examples, which should not unduly limit the scope of the claims. One of ordinary skill in the art would recognize many variations, alternatives, and modifications.

In FIG. 8(A), the polysilicon regions 740 are added to the system 100 as shown in FIG. 3 to form a system 2810 for EDS protection. The polysilicon regions 740 are not in direct contact with the gate regions 110 or the polysilicon regions 140, and the polysilicon regions 740 are not in direct contact with each other. Additionally, the polysilicon regions 740 are separated from the substrate by the dielectric layers. For example, the dielectric layers include silicon oxide. In another example, the dielectric layers are separated from each other or in direct contact with each other. In one embodiment, the polysilicon regions 740 are located within the drain regions 130 in the top view. In another embodiment, the polysilicon regions 740 are located within the source regions 120 in the top view. In yet another embodiment, the polysilicon regions 740 are located within both the source regions 120 and the drain regions 130 in the top view. For example, each of the drain regions 130 includes several doped regions in the substrate. The doped regions are not in direct contact with each other. In one embodiment, the substrate is doped to p-type, and the doped regions are N+ regions. For example, the substrate also includes a p-well. In another example, the substrate also includes at least two LDD regions for each of the doped regions. The two LDD regions are in direct contact with the corresponding doped region. In yet another example, the subs others replaced. Further details of these components are found throughout the present specification and more particularly below.

As shown in FIGS. 9(A), (B), and (C), the gate region 2110 has the same composition and the same thickness as the polysilicon region 2310. The dielectric layer 2120 has the same composition and the same thickness as the dielectric layer 2320. The LDD regions 2130 have the same doping profile as the LDD region 2330, and a different doping profile from the LDD regions 2230. For example, the LDD regions 2130 and the LDD region 2330 are formed by implantation of arsenic ions with implant energy of 3 KeV and dose of $1.05 \times 10^{15}$ cm$^{-3}$. The implant direction is perpendicular to the surface of the substrate 2160 or the surface of the substrate 2360. In another example, the LDD regions 2230 are formed by implantation of phosphors ions with implant energy of 10 KeV and dose of $1.3 \times 10^{14}$ cm$^{-3}$. The implant direction is perpendicular to the surface of the substrate 2260.

The pocket implant regions 2140 have the same doping profile as the pocket implant region 2340, and a different doping profile from the pocket implant regions 2240. For example, the pocket implant regions 2140 and the pocket implant region 2340 are formed by implantation of indium ions with implant energy of 100 KeV and does of $4.0 \times 10^{13}$ cm$^{-3}$. The implant direction is 30 degrees from the direction that is perpendicular to the surface of the substrate 2160 or the surface of the substrate 2360. In another example, the pocket implant regions 2140 and the pocket implant region 2340 are formed by implantation of boron ions with implant energy of 14 KeV and does of $1.0 \times 10^{13}$ cm$^{-3}$. The implant direction is 30 degrees from the direction that is perpendicular to the surface of the substrate 2160 or the surface of the substrate 2360. In yet another example, the pocket implant regions 2240 are formed by implantation of indium ions with implant energy of 130 KeV and does of $2.6 \times 10^{13}$ cm$^3$. The implant direction is 30 degrees from the direction that is perpendicular to the surface of the substrate 2260. In yet another example, the junction depth for the LDD regions 2130 and the pocket implant regions 2140 is the same as the junction depth for the LDD region 2330 and the pocket implant region 2340. In yet another example, the junction depth for the LDD region 2330 and the pocket implant region 2340 is different from the junction depth for the LDD regions 2230 and the pocket implant regions 2240. In yet another example, the junction doping profile for the LDD region 2330 and the pocket implant region 2340 is steeper than the junction doping profile for the LDD regions 2230 and the pocket implant regions 2240. In yet another example, the junction breakdown voltage for the LDD region 2330 and the pocket implant region 2340 is lower in magnitude than the junction breakdown voltage for the LDD regions 2230 and the pocket implant regions 2240. In yet another example, the junction doping profile for the heavily doped region 2350 and the pocket implant region 2340 is steeper than the junction doping profile for the heavily doped regions 2250 and the pocket implant regions 2240. In yet another example, the junction breakdown voltage for the heavily doped region 2350 and the pocket implant region 2340 is lower in magnitude than the junction breakdown voltage for the heavily doped regions 2250 and the pocket implant regions 2240. In yet another example, the structures 2100 and 2300 are formed by at least some same fabrication processes.

As shown in FIGS. 9(A), (B), and (D), the gate region 2110 has the same composition and the same thickness as the polysilicon region 2410. The dielectric layer 2120 has the same composition and the same thickness as the dielectric layer 2420. The LDD regions 2130 have the same junction depth as the LDD regions 2430, and a different junction depth from the LDD regions 2230. For example, the LDD regions 2130 and the LDD regions 2430 are formed by implantation of arsenic ions with implant energy of 3 KeV and dose of $1.1 \times 10^{15}$ cm$^{-3}$. The implant direction is perpendicular to the surface of the substrate 2160 or the surface of the substrate 2460. In another example, the LDD regions 2230 are formed by implantation of phosphors ions with implant energy of 10 KeV and dose of $1.3 \times 10^{14}$ cm$^{-3}$. The implant direction is perpendicular to the surface of the substrate 2260.

The pocket implant regions 2140 have the same doping profile as the pocket implant regions 2440, and a different doping profile from the pocket implant regions 2240. For example, the pocket implant regions 2140 and the pocket implant regions 2440 are formed by implantation of indium ions with implant energy of 100 KeV and does of $4.0 \times 10^{13}$ cm$^{-3}$. The implant direction is 30 degrees from the direction that is perpendicular to the surface of the substrate 2160 or the surface of the substrate 2460. In another example, the pocket implant regions 2140 and the pocket implant regions 2440 are formed by implantation of boron ions with implant energy of 14 KeV and does of $1.0 \times 10^{13}$ cm$^{-3}$. The implant direction is 30 degrees from the direction that is perpendicular to the surface of the substrate 2160 or the surface of the substrate

2460. In yet another example, the pocket implant regions 2240 are formed by implantation of indium ions with implant energy of 130 KeV and does of $2.6 \times 10^{13}$ cm$^{-3}$. The implant direction is 30 degrees from the direction that is perpendicular to the surface of the substrate 2260. In yet another example, the junction depth for the LDD regions 2130 and the pocket implant regions 2140 is the same as the junction depth for the LDD regions 2430 and the pocket implant regions 2440. In yet another example, the junction depth for the LDD regions 2430 and the pocket implant regions 2440 is different from the junction depth for the LDD regions 2230 and the pocket implant regions 2240. In yet another example, the junction doping profile for the LDD regions 2430 and the pocket implant regions 2440 is steeper than the junction doping profile for the LDD regions 2230 and the pocket implant regions 2240. In yet another example, the junction breakdown voltage for the LDD regions 2430 and the pocket implant regions 2440 is lower in magnitude than the junction breakdown voltage for the LDD regions 2230 and the pocket implant regions 2240. In yet another example, the junction doping profile for the heavily doped regions 2450 and the pocket implant regions 2440 is steeper than the junction doping profile for the heavily doped regions 2250 and the pocket implant regions 2240. In yet another example, the junction breakdown voltage for the heavily doped regions 2450 and the pocket implant regions 2440 is lower in magnitude than the junction breakdown voltage for the heavily doped regions 2250 and the pocket implant regions 2240. In yet another example, the structures 2100 and 2400 are formed by at least some same fabrication processes.

In some embodiments, the structures 2100, 2200, and 2300 are parts of the systems 100, 500, 2810, 2820, and/or 2830. In certain embodiments, the structures 2100, 2200, and 2400 are parts of the systems 700, 2810, 2820, and/or 2830.

According to another embodiment of the present invention, a system for electrostatic discharge protection includes a first transistor coupled to a first system and including a first gate, a first dielectric layer located between the first gate and a first substrate, a first source, and a first drain. The first system includes or is coupled to a core transistor, and the core transistor includes a second gate, a second dielectric layer located between the second gate and a second substrate, a second source, and a second drain. The first transistor is selected from a plurality of transistors, and the plurality of transistors include a plurality of gate regions, a plurality of source regions, and a plurality of drain regions. Each of the plurality of gate regions intersects a polysilicon region. The polysilicon region is separated from the first substrate by a third dielectric layer, and at least a part of the polysilicon region is located on an active area. The polysilicon region is adjacent to a first doped region and a second doped region, and the first doped region and the second doped region are associated with opposite charge polarities. The second dielectric layer and the third dielectric layer are associated with the same composition and the same thickness, and the second gate and the polysilicon region are associated with the same composition and the same thickness. For example, the system is implemented according to FIG. 2, FIG. 3, FIG. 4, FIG. 8(A), FIG. 9(A), FIG. 9(B), FIG. 9(C), and/or FIG. 9(D).

According to yet another embodiment, a system for electrostatic discharge protection includes a first transistor coupled to a first system and including a first gate, a first dielectric layer located between the first gate and a first substrate, a first source, and a first drain. The first system includes or is coupled to a core transistor, and the core transistor includes a second gate, a second dielectric layer located between the second gate and a second substrate, a second source, and a second drain. The first transistor is selected from a plurality of transistors, and the plurality of transistors includes a plurality of gate regions, a plurality of source regions, and a plurality of drain regions. The first substrate is separated from a first plurality of polysilicon regions by a first plurality of dielectric layers, and at least a part of each of the first plurality of polysilicon regions is located on an active area. The first plurality of polysilicon regions is not in direct contact with each other. Each of the first plurality of polysilicon regions is adjacent to a first doped region and a second doped region, and the first doped region and the second doped region are associated with opposite charge polarities. The second dielectric layer and the first plurality of dielectric layers are associated with the same composition and the same thickness, and the second gate and the first plurality of polysilicon regions are associated with the same composition and the same thickness. For example, the system is implemented according to FIG. 2, FIG. 5, FIG. 6, FIG. 8(B), FIG. 8(C), FIG. 9(A), FIG. 9(B), FIG. 9(C), and/or FIG. 9(D).

According to yet another embodiment, a system for electrostatic discharge protection includes a first transistor coupled to a first system and including a first gate, a first dielectric layer located between the first gate and a first substrate, a first source, and a first drain. The first system includes or is coupled to a core transistor, and the core transistor includes a second gate, a second dielectric layer located between the second gate and a second substrate, a second source, and a second drain. The first transistor is selected from a plurality of transistors, and the plurality of transistors includes a plurality of gate regions, a plurality of source regions, and a plurality of drain regions. The first substrate is separated from a plurality of polysilicon regions by a plurality of dielectric layers, and the plurality of polysilicon regions is on one of the plurality of drain regions or one of the plurality of source regions. The plurality of polysilicon regions is not in direct contact with each other, and each of the plurality of polysilicon regions is not in direct contact with anyone of the plurality of gate regions. Each of the plurality of polysilicon regions is adjacent to a first doped region and a second doped region, and the first doped region and the second doped region are associated with opposite charge polarities. The second dielectric layer and the plurality of dielectric layers are associated with the same composition and the same thickness, and the second gate and the plurality of polysilicon regions are associated with the same composition and the same thickness. For example, the system is implemented according to FIG. 2, FIG. 7(A), FIG. 7(B), FIG. 8(A), FIG. 8(B), FIG. 8(C), FIG. 9(A), FIG. 9(B), FIG. 9(C), and/or FIG. 9(D).

The present invention has various advantages. Some embodiments of the present invention improve the I/O ESD protection technique. For example, the junction breakdown voltages of MOS transistors are significantly lowered. In another example, the I/O transistors can turn on junction breakdown and thus prevent or reduce damages for self-protection from ESD stress. Certain embodiments of the present invention can effectively delay the time when the ESD stress current reaches the gate regions. For example, as shown in FIGS. 7(A) and (B) and 8(A), (B), and (C), the channels formed under the polysilicon regions 740 have significant resistance, which can lengthen the current paths. Some embodiments of the present invention comply with the ESD design rule. For example, to dissipate significant heat generated by high-density ESD current, the ESD design rule often allows relatively large spacing between the gate regions and drain contacts as shown in FIGS. 7(A) and (B) and 8(A), (B), and (C). In another example, the spacing is equal to or longer than 1.72 μm. Accordingly, the polysilicon regions 740 can be inserted to the drain regions of the I/O transistors in order to increase lengths of the current paths and raise the drain resistance without violating the ESD design rule. Certain embodiments of the present invention provide junction doping profiles between heavily doped regions and pocket implant regions related to floating and/or biased polysilicon regions, which are steeper than junction doping profiles between heavily doped regions and pocket implant regions for I/O transistors. For example, the heavily doped regions and pocket implant regions related to floating and/or biased polysilicon regions are made with the same implant processes as ones used for making the heavily doped regions and pocket implant regions for core transistors. Some embodiments of the present invention provide junction doping profiles between LDD regions and pocket implant regions related to floating and/or biased polysilicon regions, which are steeper than junction doping profiles between LDD regions and pocket implant regions for I/O transistors. For example, the LDD regions and pocket implant regions related to floating and/or biased polysilicon regions are made with the same implant processes as ones used for making the LDD regions and pocket implant regions for core transistors. Certain embodiments of the present invention make junction breakdown voltages related to floating and/or biased polysilicon regions significantly lower than junction breakdown voltages of conventional I/O transistors. When an ESD event occurs, the lower junction breakdown voltages allow turning on the junction breakdown more quickly; therefore the I/O transistors can be protected from ESD damage more effectively. Depending upon the embodiment, one or more of these benefits may be achieved. These and other benefits will be described in more detail throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for electrostatic discharge protection, the system comprising:
    a first transistor coupled to a first system and including a first gate, a first dielectric layer located between the first gate and a first substrate, a first source, and a first drain, the first system including or coupled to a core transistor, the core transistor including a second gate, a second dielectric layer located between the second gate and a second substrate, a second source, and a second drain;
    wherein:
        the first transistor is selected from a plurality of transistors, the plurality of transistors including a plurality of gate regions, a plurality of source regions, and a plurality of drain regions;
        the first substrate is separated from a first plurality of polysilicon regions by a first plurality of dielectric layers, at least a part of each of the first plurality of polysilicon regions being located on an active area, the first plurality of polysilicon regions being not in direct contact with each other;
        each of the first plurality of polysilicon regions is adjacent to a first doped region and a second doped region, the first doped region and the second doped region being associated with opposite charge polarities;
        the second dielectric layer and the first plurality of dielectric layers are associated with the same composition and the same thickness;
        the second gate and the first plurality of polysilicon regions are associated with the same composition and the same thickness;
        each of the first plurality of polysilicon regions intersects at least one of the plurality of gate regions;
        wherein the plurality of source regions and the plurality of drain regions are located within the active area in the first substrate, the active area being adjacent to at least an isolation region in the first substrate.

2. A system for electrostatic discharge protection, the system comprising:
    a first transistor coupled to a first system and including a first gate, a first dielectric layer located between the first gate and a first substrate, a first source, and a first drain, the first system including or coupled to a core transistor, the core transistor including a second gate, a second dielectric layer located between the second gate and a second substrate, a second source, and a second drain;
    wherein:
        the first transistor is selected from a plurality of transistors, the plurality of transistors including a plurality of gate regions, a plurality of source regions, and a plurality of drain regions;
        the first substrate is separated from a first plurality of polysilicon regions by a first plurality of dielectric layers, at least a part of each of the first plurality of polysilicon regions being located on an active area, the first plurality of polysilicon regions being not in direct contact with each other;
        each of the first plurality of polysilicon regions is adjacent to a first doped region and a second doped region, the first doped region and the second doped region being associated with opposite charge polarities;
        the second dielectric layer and the first plurality of dielectric layers are associated with the same composition and the same thickness;
        the second gate and the first plurality of polysilicon regions are associated with the same composition and the same thickness;
        the plurality of source regions and the plurality of drain regions are located within the active area in the first substrate, the active area being adjacent to at least an isolation region in the first substrate;
        the second drain includes a third doped region formed on an upper part of the second drain and a fourth doped region disposed above the third doped region, the third doped region and the fourth doped region being associated with opposite charge polarities;
        the first doped region and the third doped region are associated with the same doping profile;
        the second doped region and the fourth doped region are associated with the same doping profile.

3. The system of claim 2 wherein:
    the first drain includes a fifth doped region formed on an upper part of the first drain and a sixth doped region disposed above the fifth doped region, the fifth doped region and the sixth doped region being associated with opposite charge polarities;
    the third doped region and the fourth doped region form a first junction associated with a first breakdown voltage;
    the fourth doped region and the sixth doped region form a second junction associated with a second breakdown voltage;
    the second breakdown voltage is lower than the first breakdown voltage in magnitude.

4. The system of claim 1 wherein each of the first plurality of polysilicon regions does not intersect anyone of the plurality of gate regions.

5. The system of claim 1 wherein the active area is surrounded by at least the isolation region in the substrate.

6. The system of claim 1, and further comprising a second plurality of polysilicon regions, the second plurality of polysilicon regions being separated from the first substrate by a second plurality of dielectric layers.

7. The system of claim 6 wherein:
the second plurality of polysilicon regions is on one of the plurality of drain regions or one of the plurality of source regions;
the second plurality of polysilicon regions are not in direct contact with each other;
each of the second plurality of polysilicon regions is not in direct contact with anyone of the plurality of gate regions.

8. A system for electrostatic discharge protection, the system comprising:
a first transistor coupled to a first system and including a first gate, a first dielectric layer located between the first gate and a first substrate, a first source, and a first drain, the first system including or coupled to a core transistor, the core transistor including a second gate, a second dielectric layer located between the second gate and a second substrate, a second source, and a second drain;
wherein:
the first transistor is selected from a plurality of transistors, the plurality of transistors including a plurality of gate regions, a plurality of source regions, and a plurality of drain regions;
the first substrate is separated from a first plurality of polysilicon regions by a first plurality of dielectric layers, at least a part of each of the first plurality of polysilicon regions being located on an active area, the first plurality of polysilicon regions being not in direct contact with each other;
each of the first plurality of polysilicon regions is adjacent to a first doped region and a second doped region, the first doped region and the second doped region being associated with opposite charge polarities;
the second dielectric layer and the first plurality of dielectric layers are associated with the same composition and the same thickness;
the second gate and the first plurality of polysilicon regions are associated with the same composition and the same thickness;
wherein the plurality of source regions and the plurality of drain regions are located within the active area in the first substrate, the active area being adjacent to at least an isolation region in the first substrate;
wherein in a top view each of the first plurality of polysilicon regions is at least partially located within the active region;
the top view is directed to a surface of the first substrate;
the first plurality of dielectric layers are on the surface;
wherein a first one of the first plurality of polysilicon regions intersects two adjacent gate regions and a second one of the plurality of the first plurality of polysilicon regions intersects the two adjacent gate regions to form a structure that entirely surrounds at least one of the plurality of drain regions on all sides.

9. The system of claim 8 wherein:
each of the first plurality of polysilicon regions does not intersect anyone of the plurality of gate regions;
in the top view the first plurality of polysilicon regions and the plurality of gate regions are around the plurality of drain regions respectively.

10. The system of claim 1 wherein the first substrate and the second substrate are the same.

* * * * *